US012800642B2

(12) United States Patent
Saadat

(10) Patent No.: US 12,800,642 B2
(45) Date of Patent: Nov. 17, 2026

(54) METHOD FOR MONITORING A SEMICONDUCTOR SWITCH FOR FAILURE AND INVERTER SWITCHING

(71) Applicant: SEG Automotive Germany GmbH, Stuttgart (DE)

(72) Inventor: Nima Saadat, Stuttgart (DE)

(73) Assignee: SEG Automotive Germany GmbH, Stuttgart (DE)

( * ) Notice: Subject to any disclaimer, the term of this patent is extended or adjusted under 35 U.S.C. 154(b) by 191 days.

(21) Appl. No.: 18/765,526

(22) Filed: Jul. 8, 2024

(65) Prior Publication Data

US 2025/0020711 A1 Jan. 16, 2025

(30) Foreign Application Priority Data

Jul. 12, 2023 (DE) ........................ 102023118441.5

(51) Int. Cl.
*G01R 31/26* (2020.01)
*H02M 7/537* (2006.01)

(52) U.S. Cl.
CPC ..... *G01R 31/2601* (2013.01); *G01R 31/2607* (2013.01); *H02M 7/537* (2013.01)

(58) Field of Classification Search
CPC ............ G01R 31/3277; G01R 31/2601; G01R 1/2607
See application file for complete search history.

(56) References Cited

U.S. PATENT DOCUMENTS 11,139,812 B2 * 10/2021 Kempitiya ........... H03K 17/127
2014/0203843 A1 * 7/2014 Cottell .................. H03K 17/78 327/81

FOREIGN PATENT DOCUMENTS

CN 110470967 A 11/2019
DE 102020124923 A1 4/2021

OTHER PUBLICATIONS

INFINEON: What you need to know about short circuit protection. Resources, Biogs, D-81726 Munchen, 2022, URL: https://community.infineon.com/ t5/Blogs/What-you-need-t••know-about-short-circui••protection/ba-p/347057—Firmenschrift.
German Search Report in corresponding German Patent Application No. 102023118441.5, dated Jun. 19, 2024, 1 page.

* cited by examiner

*Primary Examiner* — Tung X Nguyen
(74) *Attorney, Agent, or Firm* — Cozen O'Connor

(57) ABSTRACT

A semiconductor switch has a control terminal, a current input terminal and a current output terminal. A method for monitoring the semiconductor switch, in particular to monitor the electrical connections, includes monitoring the voltage between the current input terminal and the current output terminal (drain-source voltage or collector-emitter voltage) without having to measure it directly. In particular, a simple circuit (which is also referred to below as a DeSat circuit) is used between the current input terminal and a potential terminal instead, whereby the current input terminal is connected to the potential terminal via a reverse-biased diode, a connection point of a capacitor whose other connection point is connected to ground, a resistor component and a current source. The drain-source voltage can be determined from the voltage dropping across the capacitor.

19 Claims, 4 Drawing Sheets

METHOD FOR MONITORING A SEMICONDUCTOR SWITCH FOR FAILURE AND INVERTER SWITCHING

CROSS-REFERENCE TO RELATED APPLICATIONS

This application claims priority to German Patent Application No. 102023118441.5 filed on 12 Jul. 2023, which is hereby incorporated by reference.

TECHNICAL FIELD

The present disclosure relates to a method for monitoring a semiconductor switch and an inverter circuit for carrying out the method.

BACKGROUND

Thermomechanical stresses due to load and temperature changes in semiconductor switches (e.g. MOSFETs or IGBTs) are the main causes of failures in the switches. The thermomechanical stresses can cause various failures, such as Heel cracks in the wire bonds due to cyclic displacement of the wires, fatigue of the solder at the die attachment (the resistance of the die attachment solder layer increases as the solder layer deteriorates) or lift-off of the bond wire (temperature fluctuation leads to a change in the length of the wire; since both wire ends are mechanically fixed, micro-movements occur, which lead to stresses at the bonding interface of the bond wires and finally to lift-off of the bond wire).

Such faults can be detected by monitoring the drain-source voltage $V_{DSon}$ across the switch or by measuring the switch-on resistance $R_{DS}$ (or $R_{DSon}$) of the switch and comparing it with previously measured values. Any significant change in the drain-source voltage or its on-resistance may indicate degradation or premature failure of the bond wires or solder layer. However, the measurements are strongly influenced by parasitic elements in the components (bond wires, etc.). Random calibration is also required to compensate for the influence of intermediate connections. Thus, the determination of $V_{DSon}$ or $R_{DS}$ is not very accurate and also requires complicated circuits to measure $V_{DSon}$, especially for high-voltage (HV) switches. In the latter case, it is also necessary to separate or isolate the high-voltage area from the evaluation electronics, which makes the transmission of the measured signal from the power electronics to the evaluation electronics very complex due to the isolation and also the interference immunity. In turn, the measurement of $R_{DS}$ is heavily dependent on the load current. Other methods for fault detection are, for example, measuring the gate peak current or the Miller plateau length when the gate driver is switched off.

SUMMARY

According to the disclosure, a method for monitoring a semiconductor switch and an inverter circuit for carrying out the method are proposed with the features of the independent patent claims. Advantageous embodiments are the subject of the dependent claims and the following description.

In order to monitor the semiconductor switch, which has a control terminal, a current input terminal and a current output terminal, in particular to monitor the electrical connections, the disclosure proposes monitoring the voltage between the current input terminal and the current output terminal (drain-source voltage or collector-emitter voltage) without having to measure it directly. In particular, a simple circuit (which is also referred to below as a DeSat circuit) is used between the current input terminal and a potential terminal instead, whereby the current input terminal is connected to the potential terminal via a reverse-biased diode, a connection point of a capacitor whose other connection point is connected to ground, a resistor component and a current source. The drain-source voltage can be determined from the voltage dropping across the capacitor.

This is particularly advantageous because the concept of desaturation (DeSat) protection, which is known per se for semiconductor switches, can be used for the circuit configuration described with a minimum of additional components, so that the effort and costs are considerably reduced. Commercially available gate driver ICs (hereinafter referred to as gate drivers) can have a DeSat connection to which the drain connection of the semiconductor switch is connected via a DeSat circuit as described above. The gate driver can thus monitor the semiconductor switch for overcurrent or short circuit and switch it off in the event of a fault. In the context of the disclosure, a deteriorating or even failed electrical connection of the semiconductor switch is now detected by a special evaluation of voltages in the DeSat circuit.

Specifically, the DeSat voltage dropping across the capacitor is determined at a first point in time and at a second point in time, and a drain-source voltage dropping between the current input terminal and the current output terminal of the semiconductor switch at the first point in time is determined from the DeSat voltage determined at the first point in time and the DeSat voltage determined at the second point in time. These steps are repeated for several different first points in time in order to obtain a plurality of drain-source voltages for the several different first points in time. A functionality or operability of the semiconductor switch is then determined from the plurality of drain-source voltages for the plurality of different first points in time.

The disclosure overcomes the disadvantages of the prior art and in particular leads to a number of advantages. Neither $V_{DSon}$ nor $R_{DS}$ need to be measured in order to measure the voltage of the switch or the switch-on resistance of the switch in the on-state; instead, these can be derived very simply from the DeSat voltage.

A data interface can be used to transmit the measurement signals to the evaluation electronics (control unit) with appropriately equipped gate drivers, so that no additional signal transmission is required. The isolation of the measured signal is then also provided by the isolation of the gate driver.

The proposed concept can be used for online monitoring of the state of the semiconductor switch and online fault detection.

No additional space is required as no precise high-bandwidth current sensor needs to be added to each switch. This is particularly advantageous for Transistor Outline (TO) housings connected to the busbars or PCB (printed circuit board), where space is usually limited. Furthermore, the disclosure can be advantageously used for power modules that contain several parallel chips.

The proposed method is hardly dependent on the load current and the temperature of the DeSat circuit.

Existing temperature sensors for the switch and also the phase current measurement can be used for detection purposes without the need for additional sensors.

The disclosure has particular advantages for semiconductor switches which are used in an inverter circuit to control an electric machine, in particular in vehicles, for example as a drive or traction drive, since large currents flow here and evaluation is therefore simplified. As is known, an inverter circuit or a power converter circuit is used to connect AC voltage terminals of the electric machine to DC voltage terminals of a network, such as a vehicle network, and to convert the voltages accordingly. The inverter circuit has a number of semiconductor switches for this purpose, each of which can be opened (non-conductive) and closed (conductive) in accordance with a control signal. The semiconductor switches can comprise MOSFETs and IGBTs, for example gallium nitride (GaN) or silicon carbide (SiC) FETs. The vehicle network can be a low-voltage network or a high-voltage network, whereby in the latter case a low-voltage network is also present to supply the components of the inverter circuit with electricity. The high-voltage network and low-voltage network can be coupled in the vehicle via a suitable DC/DC converter. The nominal voltage level of the high-voltage network (hereinafter also referred to as the high-voltage level) can, for example, be significantly higher than a permissible touch voltage, in particular 60 V, e.g. up to several hundred volts. For example, high-voltage levels of 400 V or 800 V are often used in current electric vehicles. The nominal voltage level of the low-voltage network can, for example, correspond to standard vehicle low voltages of 12 V or 24 V, for example.

In one embodiment, the inverter circuit can have a number of high-side semiconductor switches and a number of low-side semiconductor switches and at least one gate driver for one or more of the semiconductor switches in each case. The gate driver is used to apply a control signal to a control terminal of a semiconductor switch (e.g. gate terminal of MOSFET). In particular, the gate driver has a DeSat connection.

Further advantages and embodiments of the disclosure are shown in the description and the accompanying drawing.

The disclosure is illustrated schematically in the drawing by means of embodiment examples and is described below with reference to the drawing.

DETAILED DESCRIPTION

Figure 1:
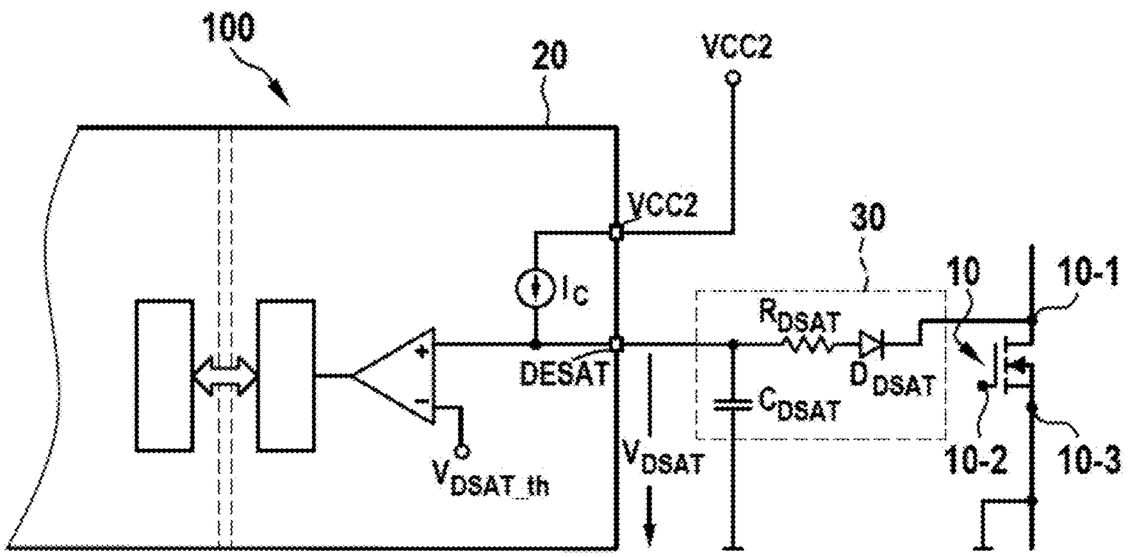
FIG. 1 shows a circuit arrangement with a semiconductor switch, a gate driver and a DeSat circuit, in embodiments.

FIG. 1 shows a schematic representation of a circuit arrangement, such as that on which the disclosure may be based, and is labeled 100. The circuit arrangement has a semiconductor switch 10 and a gate driver 20 for controlling (and monitoring) the semiconductor switch 10. In particular, the circuit arrangement can be part of an inverter circuit.

The semiconductor switch 10 has a current input terminal 10-1, a control terminal 10-2 and a current output terminal 10-3. In the present case, the semiconductor switch 10 is illustrated as a MOSFET or SIC MOSFET, so that the terminals are usually and hereinafter referred to as drain, gate and source. However, it can also be an IGBT, in which case the connections are usually referred to as collector, gate and emitter.

The gate driver 20 comprises a terminal or pin DESAT, which can be used to monitor the semiconductor switch 10 if it is correctly connected. Internal components of the gate driver 20 are only partially indicated, but the DESAT connection is usually connected via a current source (here $I_C$) to a voltage supply (here VCC2) via a terminal VCC2 and to a comparator (here operational amplifier), which compares the voltage $V_{DSAT}$ dropping between the DESAT pin and ground with an internal threshold voltage (here $V_{DSAT\_th}$) and initiates protective measures depending on the comparison result.

A DeSat circuit 30 is arranged between the current input terminal or drain terminal 10-1 of the semiconductor switch 10 and the DeSat terminal DESAT of the gate driver 20, which has a resistor component (hereinafter also simply a resistor) $R_{DSAT}$, a blanking capacitor $C_{DSAT}$ and a diode $D_{DSAT}$. The diode is connected to the drain terminal 10-1 of the semiconductor switch 10 to be monitored. It should be noted at this point that the diode can also be connected to the drain terminals of several semiconductor switches to be monitored. In series with the diode $D_{DSAT}$ and the resistor component $R_{DSAT}$ is the connection point of the capacitor $C_{DSAT}$, the other connection point of which is connected to ground.

When the circuit arrangement 100 is switched on, the current source $I_C$ charges the blanking capacitor $C_{DSAT}$ and the diode $D_{DSAT}$ is conductive. The current strength of $I_C$ can be adjustable, but is also fixed in some gate drivers. In normal operation, the voltage of the capacitor is clamped to the forward voltage of the diode. In the event of a short circuit or generally a very high load current through the semiconductor switch, the diode becomes non-conductive and the DeSat voltage $V_{DSAT}$ dropping between the DESAT terminal and ground (or across the capacitor) is then quickly charged to the threshold voltage (by the current source), which triggers the DeSat protection function on the gate driver side and leads to the semiconductor switch being switched off. The switch-off process can be carried out as a soft turn-off to prevent damage to the switch due to the overvoltage that occurs during switch-off.

In such a circuit arrangement, the drain-source voltage $V_{DSon}$ can also be derived from available measured values in accordance with embodiments of the disclosure. In principle, $V_{DSon}$ is obtained using the following equations (1) and (2):

$$V_{DSAT} = I_C \times R_{DSAT} + V_{F,DSAT} + V_{DSon} \quad (1)$$

$$V_{DSon} = V_{Desat} - I_C \times R_{DSAT} - V_{F,DSAT} \quad (2)$$

with $V_{F,DSAT}$: forward voltage of the diode

However, the forward voltage $V_{F,DSAT}$ of the diode and the resistance (value) of the component $R_{DSAT}$ are strongly temperature-dependent, which negatively influences the accuracy of the calculated value $R_{DSon}$.

Figure 2:
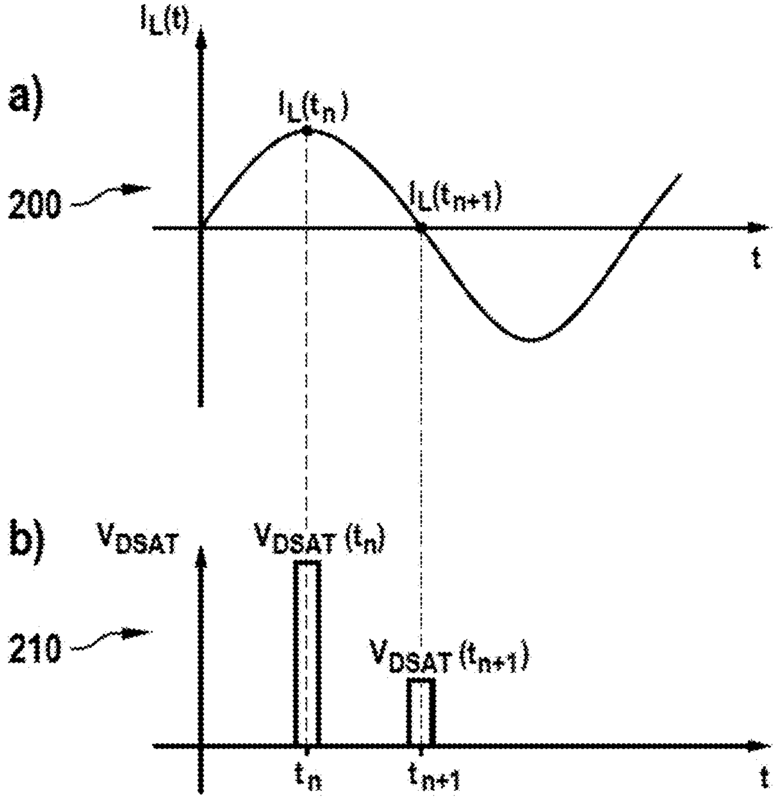
FIG. 2 shows in two views a) and b) a sinusoidal load current curve and associated DeSat voltages as measured in embodiments.

FIG. 2 shows schematically in a view a) in a diagram 200 a curve of a load current $I_L(t)$ over time t for a typical sinusoidal case, e.g. during motor operation of an electric machine, and in a view b) in a diagram 210 associated values of the measurable DeSat voltage $V_{DSAT}$. For a peak value at $t_n$ and a zero crossing at $t_{n+1}$ of the load current, the values of the DeSat voltage $V_{DSAT}(t_n)$ and $V_{DSAT}(t_{n+1})$ are shown.

Typical inverter circuits normally already have a load or phase current measurement, so that no additional current sensor is required. This sensor is used in embodiments of the disclosure and is arranged on the load side. If this is a high-voltage network, for example, the output of the sensor must be isolated and then sent to the evaluating control unit, which is usually located in a low-voltage network.

$V_{DSAT}$ can be measured in the gate driver (see also FIG. 4) or with an external voltage measurement circuit (see also FIG. 5); as this measurement also takes place in the high-voltage network, it must also be isolated from the low-voltage network.

A first measurement takes place at a first point in time $t_n$, whereby a first load current $I_L(t_n)$ flows through the semiconductor switch 10 as a drain current ($I_D$). The following then applies:

$$V_{DSon}(t_n) = V_{DSAT}(t_n) - I_C \times R_{DSAT}(t_n) - V_{F,DSAT}(t_n) = V_{DSAT}(t_n) - V_{drop}(t_n) \quad (3)$$

with a voltage drop $V_{drop}(t_n)$ across the DeSat resistor component and the DeSat diode of $$V_{drop}(t_n) = I_C \times R_{DSAT}(t_n) + V_{F,DSAT}(t_n) \quad (4)$$

If the first measurement is carried out at the apex of the current wave, or at a sufficiently high value, this is advantageous for the signal/noise ratio.

In the next step, the measurement takes place at a different point in time $t_{n+1}$ of the load current cycle (see FIG. 2). The following applies:

$$V_{DSon}(t_{n+1}) = V_{DSAT}(t_{n+1}) - I_C \times R_{DSAT}(t_{n+1}) - V_{F,DSAT}(t_{n+1}) = V_{DSAT}(t_{n+1}) - V_{drop}(t_{n+1}) \quad (5)$$

$$V_{drop}(t_{n+1}) = I_C \times R_{DSAT}(t_{n+1}) + V_{F,DSAT}(t_{n+1}) \quad (6)$$

If, in one embodiment, the second measurement is carried out at a time when the current is as low as possible, but the semiconductor switch is still conducting, for example at or near the zero crossing (see FIG. 2), this results in a very simple evaluation, since the load current is very low or almost zero at the second time and the voltage drop across the switch is therefore negligible, i.e. $V_{DSon}(t_{n+1}) \approx 0$.

In particular, it must be ensured that the semiconductor switch 10 is conductive at the first point in time $t_n$ and at the second point in time $t_{n+1}$. Advantageously, a situation arises in which the DeSat voltage determined at the first point in time $t_n$ is greater, in particular significantly greater, e.g. by a factor of 2 or more, than the DeSat voltage determined at the second point in time $t_{n+1}$.

The following applies:

$$V_{DSAT}(t_{n+1}) = I_C \times R_{DSAT}(t_{n+1}) + V_{F,DSAT}(t_{n+1}) = V_{drop}(t_{n+1}) \quad (7)$$

If the two measurements are very close to each other in terms of duration (e.g. a few 10 to 100 ms), it can be assumed that the temperature of the semiconductor switch, the DeSat diode and the DeSat resistor component has not changed significantly. Therefore, no change in $V_{drop}$ is expected for two consecutive measurements $t_n$, $t_{n+1}$ within one electrical cycle, or in other words, if the semiconductor switch 10 is non-conductive between the first time $t_n$ and the second time $t_{n+1}$. Then the following applies:

$$V_{drop}(t_n) = V_{drop}(t_{n+1}) \quad (8)$$

The effect of $V_{drop}$ on the measurement can therefore be neglected, so that the following applies:

$$V_{DSon}(I_L(t_n), T_j) = V_{DSAT}(t_n) - I_C \times R_{DSAT}(t_n) - V_{F,DSAT}(t_n) = V_{DSAT}(t_n) - V_{DSAT}(t_{n+1}) \quad (9)$$

Thus, the drain-source voltage $V_{DSon}(I_L(t_n),T_j)$ for a specific load current $I_L(t_n)$ and a specific junction temperature $T_j$ results from two successive measurements of $V_{DSAT}$ (i.e. $V_{DSAT}(t_n)$ for a first point in time and $V_{DSAT}(t_{n+1})$ for a second point in time) in the event that the load current $I_L(t_{n+1})$ is (essentially) zero at the second measurement or at the second point in time.

From the drain-source voltage $V_{DSon}(I_L(t_n),T_j)$ and the load current $I_L(t_n)$, it is possible to determine the switch-on resistance $R_{DSon}(I_L(t_n),T_j)$, but is not necessary for the invention. After determining the drain-source voltage $V_{DSon}(I_L(t_n),T_j)$ using equation (9), the value is conveniently stored in a storage device, such as a local non-volatile memory or a remote memory (such as a cloud), as a table for given temperatures and load currents.

By comparing a current drain-source voltage (and/or a current turn-on resistance) with an earlier value, or in other words by comparing a drain-source voltage at a current first point in time with a drain-source voltage at an earlier first point in time, a operability of the semiconductor switch can be monitored or checked. In particular, the operability can be determined from the comparison result, whereby a malfunction can be inferred in the event of a significant deviation (i.e. if a difference between the drain-source voltage at the current first point in time and the drain-source voltage at the earlier first point in time exceeds a threshold value). Such a malfunction may include, for example, a poor electrical connection.

If the operability of the semiconductor switch is determined to be insufficient, a measure can be carried out, e.g. a repair request, a fault memory entry, etc. can be triggered or carried out.

To enable a meaningful comparison of the calculated $V_{DSon}$ and/or $R_{DSon}$ with previously measured values, the comparison should be carried out with the same load current $I_L$. (drain current $I_D$) (within permissible tolerances) and the same junction temperature $T_j$ (within permissible tolerances). The load current is usually measured in inverters for control and protection purposes anyway. Therefore, if a high-resolution and accurate load current is available, this value can be used for the analysis. The junction temperature is also usually determined, e.g. estimated, in inverters for protection and de-rating purposes.

Figure 3:
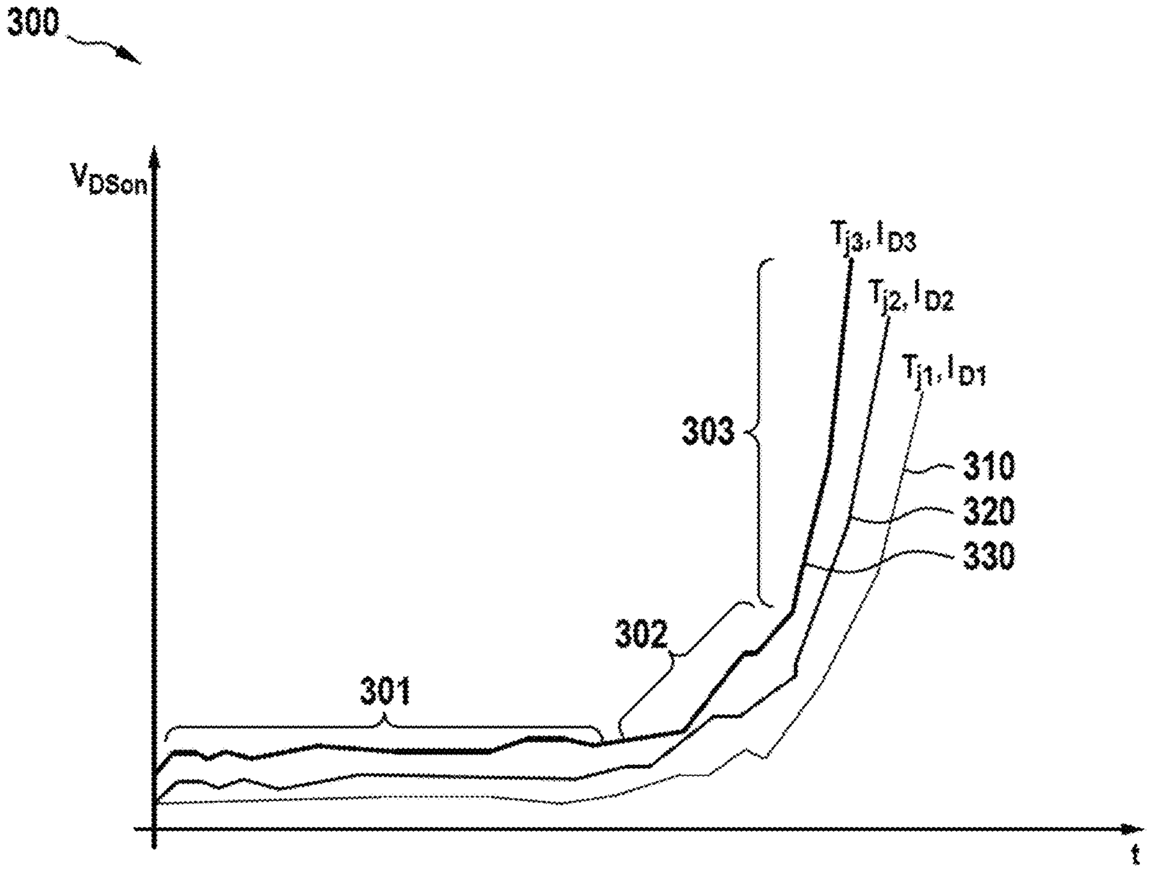
FIG. 3 shows curves of the drain-source voltage $V_{DSon}$ for different load current and junction temperature values in the semiconductor switch, as can be measured in embodiments.

FIG. 3 shows in a diagram 300 a plot of, as explained above, determined or stored values of the drain-source voltage $V_{DSon}(I_L(t_n),T_j)$ over time or a number of switching cycles. In the example shown, three graphs 310, 320 and 330 are shown for three different temperature/load current pairs ($T_{ji}/I_{Di}$, i=1, 2, 3).

It can be seen that initially no significant change in the value can be seen in a period 301, and then the value gradually increases in a period 302 before rising sharply in a period 303. This means that the electrical connection of the semiconductor switch in period 301 is little to undamaged; this indicates a normal wear or degradation. Increasing degradation or deterioration occurs in period 302, which can include detachment of bonding wires and/or solder defects. In period 303, failure is imminent or has already occurred.

In particular, in embodiments of the disclosure, if it is determined that the semiconductor switch is in the r period 302, this can be determined as an insufficient operability of the semiconductor switch, and an action such as a repair request, a fault memory entry, etc. can be triggered or performed. Detection can take place, for example, by comparison with previous values. For example, a fault can be detected if the current value deviates from a reference value by more than a permissible tolerance threshold. For example, a moving average can be determined as a reference value.

Figure 4:
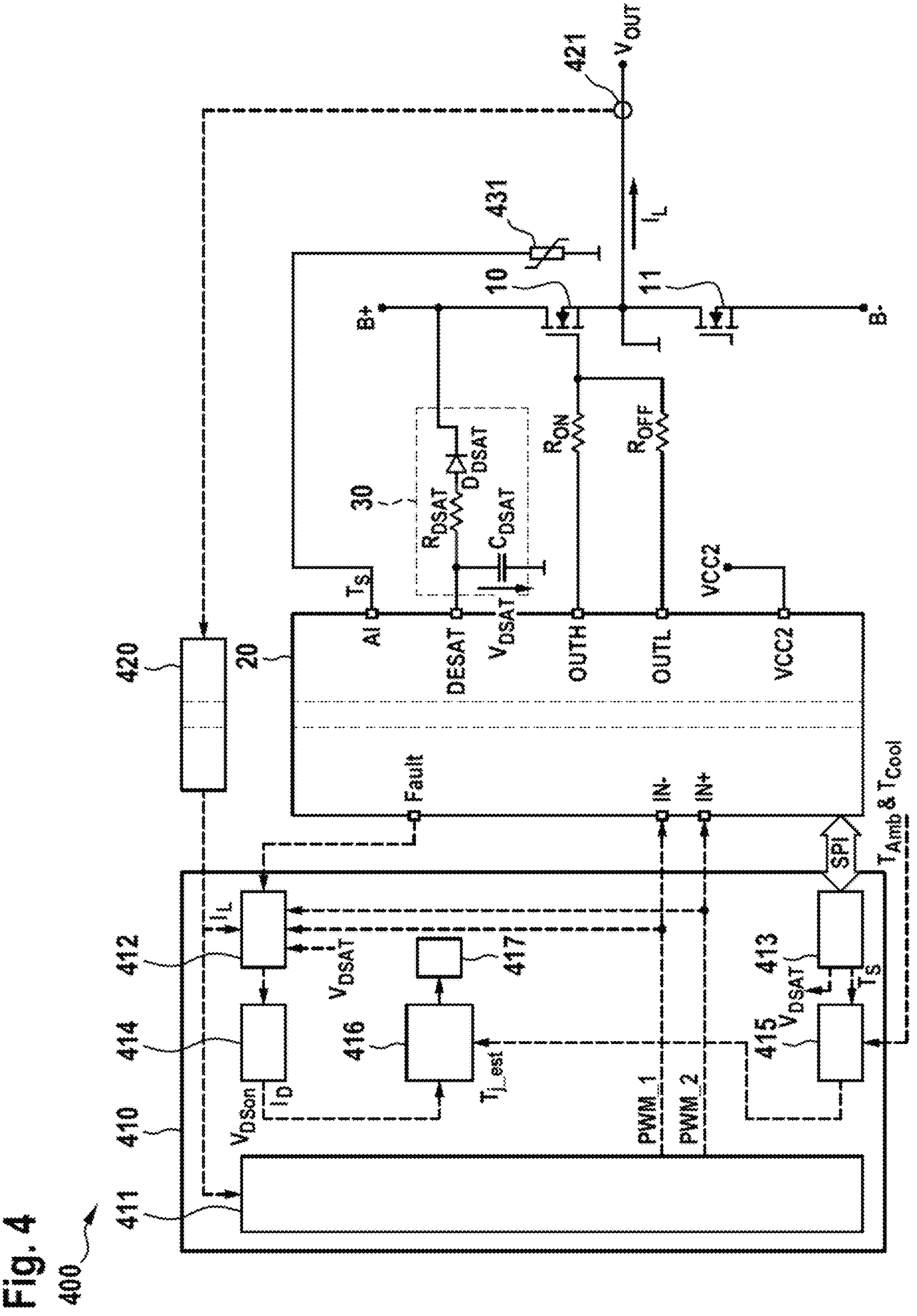
FIG. 4 shows a section of an inverter circuit, in embodiments.

In FIG. 4, a section of an embodiment of an inverter circuit according to an embodiment of the disclosure is shown schematically and in the form of a circuit diagram and is labeled 400. The inverter circuit can be used to control an electric machine (not shown), for example in a vehicle. The inverter circuit is set up to monitor a semiconductor switch 10, which in the present case is arranged in a half-bridge arrangement as a so-called high-side switch with a further semiconductor switch 11 as a low-side switch. However, it should be noted that the low-side switch 11 can also be monitored additionally or alternatively.

The inverter circuit 400 has a gate driver 20, a DeSat circuit 30 and a control unit 410. The control unit 410 can be a local control unit of the inverter circuit, for example an electric motor control unit (MCU), or all data can be transmitted to a remote control unit or a cloud and then analyzed remotely. In this example, the use of a local control unit is shown.

The half-bridge arrangement is connected to a terminal B+ on the supply side and to a terminal B-on the ground side, which can be supplied, for example, from a DC link and/or a high-voltage network of a vehicle. The center tap of the half-bridge arrangement is connected as load terminal $V_{OUT}$ to a stator or phase winding of the electric machine, for example.

A desired load current $I_L$ can be generated in the stator winding by selectively controlling the semiconductor switches 10 and 11. In the example shown, a load current measurement is realized by means of a current measuring circuit 420, which can be connected, for example, to a corresponding current sensor 421 in the phase winding or its supply line.

A temperature measurement is realized by means of a temperature sensor 431, for example a PTC or NTC, which is connected to an analog input AI of the gate driver 20 in the present case. The temperature sensor 431 can be installed on the power module or on the housing of the semiconductor switch 10 and detect a temperature $T_S$ of the semiconductor switch 10.

The control unit 410 contains a logic unit 411, which implements the functionality of the control unit 410 in terms of programming.

The modules used to implement one embodiment of the invention are shown separately and, in particular, independently of the logic unit 411. As explained, they can also be implemented elsewhere or in other control units. However, implementation in an MCU is advantageous, since much of the required information or data is available there anyway.

In particular, the logic unit 411 determines PWM signals PWM_1 and PWM_2 for controlling the semiconductor switches 10 and 11, which are routed to inputs IN− and IN+ of the gate driver 20 and to an ADC unit 412. The gate driver 20 outputs the control signals (in this case separate signals for ON and OFF) for the semiconductor switch 10 at outputs OUTH or OUTL, which are connected to the gate 10-2 via current limiting resistors $R_{ON}$ and $R_{OFF}$. One or more separate gate driver(s) (not shown) must be provided for the semiconductor switch 11, which can be constructed and connected in the same way as the gate driver 20, or corresponding additional terminals (not shown) must be provided in the gate driver 20.

The ADC unit 412 is used to acquire and digitize various input signals, as shown, which originate, for example, from the gate driver 20 and the current measurement circuit 420 or within the control unit 410. The PWM signals PWM_1 and PWM_2 are used to determine suitable first and second points in time for the measurement, for example apex and zero crossing. The PWM_1 and PWM_2 signals can also be used to derive when the semiconductor switches 10 and 11 are conducting or non-conducting. The variables used in equation (9) may only be determined on a conductive semiconductor switch 10.

Data required for the further process, such as the load current or drain current $I_L(=I_D)$, are transferred to a calculation module 414 and/or a memory module 416.

By means of a digital data interface 413, e.g. an SPI interface, data can be exchanged digitally between the gate driver 20 and the control unit 410, whereby in the present example the temperature $T_S$ of the semiconductor switch 10 and the DeSat voltage $V_{DSAT}$ are included. The DeSat voltage $V_{DSAT}$ is transferred to the calculation module 414, which uses it to calculate the drain-source voltage $V_{DSon}$, as described above, and transfers it to the memory module 416.

The ADC unit 412 (or the data interface 413) can also be used to receive an error signal from the gate driver 20 ("Fault" terminal). For further analysis, an error status of the gate driver can then also be read out by means of the data interface 413. In the event of a fault or the receipt of a fault signal, the DeSat values should not be used to monitor the status of the switch.

A current junction temperature $T_{j\_est}$ of the semiconductor switch 10 is determined by means of a program unit for a thermal model 415. For this purpose, in addition to the temperature measured at the semiconductor switch 10, a coolant temperature $T_{Cool}$ and/or an ambient temperature $T_{Amb}$ (e.g. depending on whether air-cooled or water-cooled) can also be fed to the control unit. For example, the junction temperature $T_{j\_est}$ can be calculated based on the coolant temperature from a "junction-to-cooling" thermal resistance and the current power consumption, which in turn can be determined, for example, from the load current and the drain-source voltage. Alternatively, a temperature characteristic of the semiconductor switch 10 can also be measured and stored as a function of $R_{DS}$ at different load currents. The junction temperature can be easily estimated from $R_{DS}$ at a given $I_D$ (or $I_L$).

In the memory module 416, the recorded values are stored as described above and shown, for example, in FIG. 3, in particular as time series and for specific load current/junction temperature pairs.

In a fault detection module 417, fault detection is based on the stored values, as explained above.

Figure 5:
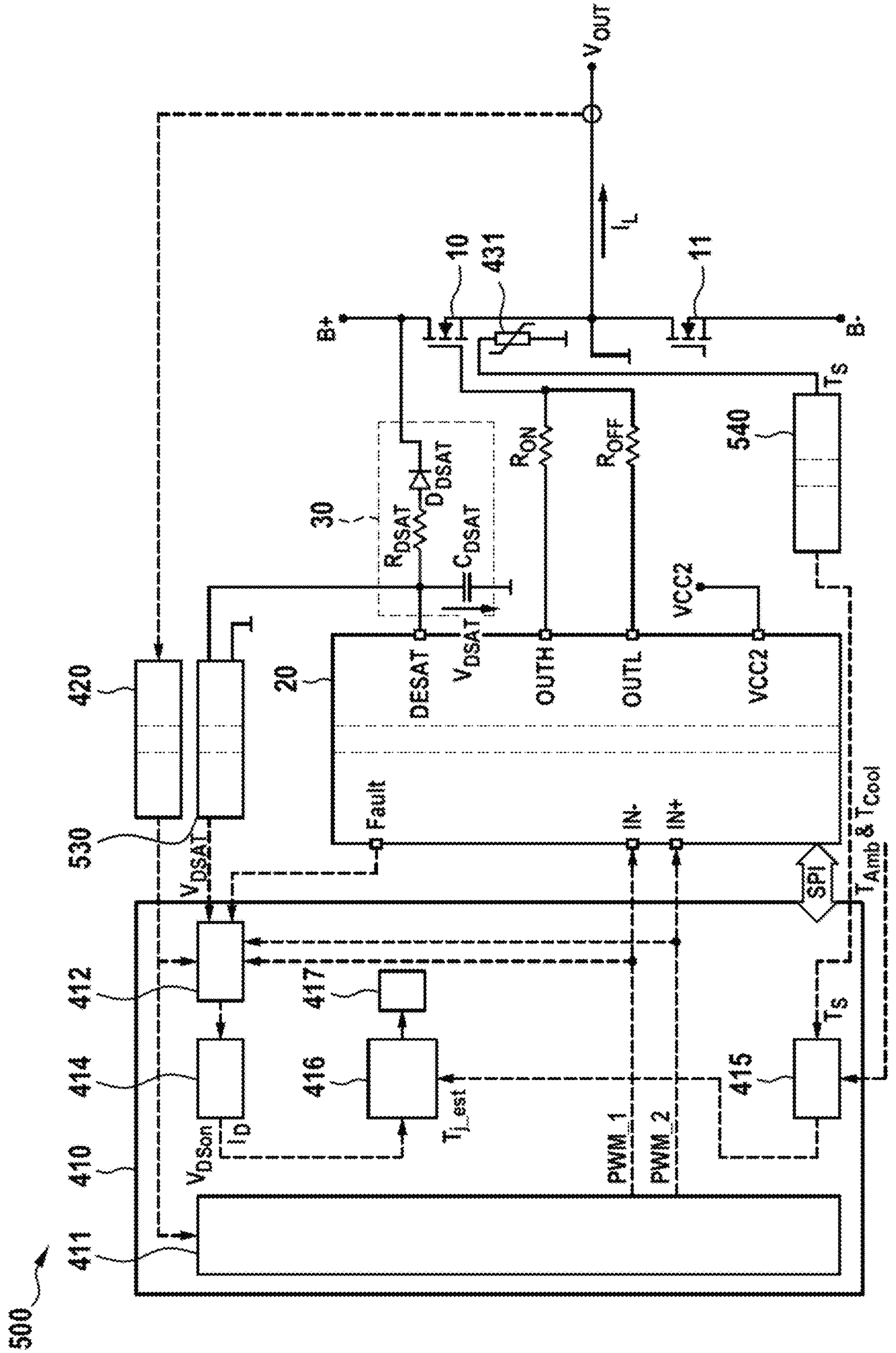
FIG. 5 shows a section of a further inverter circuit, in embodiments.

In FIG. 5, a section of a further embodiment 500 of an inverter circuit is shown schematically and like a circuit diagram, which essentially corresponds to the embodiment 400 according to FIG. 4. In contrast to the embodiment shown in FIG. 4, here the DeSat voltage is not transmitted digitally from the gate driver 20 via the data interface 413, but is measured and transmitted by a separate DeSat voltage measurement circuit 530.

As explained, the half-bridge arrangement can be arranged in a high-voltage network, whereas the control unit 410 and other modules in both FIGS. 4 and 5 are supplied from a low-voltage network. A separation or isolation between the high-voltage network and the low-voltage network is shown by dashed lines in the gate driver 20 and the modules 420, 530.

The invention claimed is:

1. A method for monitoring a semiconductor switch (10) which has a control terminal (10-2), a current input terminal (10-1) and a current output terminal (10-3), the current input terminal (10-1) being connected to a potential terminal (VCC) via a reverse-connected diode ($D_{DSAT}$), a connection point of a capacitor ($C_{DSAT}$) whose other connection point is connected to ground, a resistor component ($R_{DSAT}$) and a current source ($I_C$), having the following steps:

a) determining a DeSat voltage ($V_{DSAT}$) dropping across the capacitor ($C_{DSAT}$) at a first point in time ($t_n$) and at a second point in time ($t_{n+1}$);

b) determining a drain-source voltage dropping between the current input terminal (10-1) and the current output terminal (10-3) of the semiconductor switch (10) at the first point in time ($t_n$) from the DeSat voltage ($V_{DSAT}$) determined at the first point in time ($t_n$) and the DeSat voltage ($V_{n+1}$) determined at the second point in time ($t_{n+1}$);

c) repeating steps a) and b) for a plurality of different first points in time and obtaining a plurality (310, 320, 330) of drain-source voltages for the plurality of different first points in time;

d) determining an operability of the semiconductor switch (10) from the plurality (310, 320, 330) of drain-source voltages for the plurality of different first timings.

2. The method according to claim 1, wherein the DeSat voltage ($V_{DSAT}$) dropping across the capacitor ($C_{DSAT}$) is determined by means of a DeSat voltage measuring circuit (530).

3. The method according to claim 1, wherein the current input terminal (10-1) is connected to a DeSat terminal (DESAT) of a gate driver (20) via the reverse-connected diode ($D_{DSAT}$), the connection point of the capacitor ($C_{DSAT}$) and the resistor component ($R_{DSAT}$), wherein the DeSat terminal (DESAT) of the gate driver (20) is connected to the potential terminal (VCC) via a current source ($I_C$) of the gate driver (20).

4. The method according to claim 3, wherein the DeSat voltage ($V_{DSAT}$) dropping across the capacitor ($C_{DSAT}$) is determined within the gate driver (20).

5. The method according claim 1, wherein the semiconductor switch (10) is conductive at the first point in time ($t_n$) and at the second point in time ($t_{n+1}$), and wherein the semiconductor switch (10) is in particular non-conductive between the first point in time ($t_n$) and the second point in time ($t_{n+1}$).

6. The method according claim 1, wherein the time between the first point in time ($t_n$) and the second point in time ($t_{n+1}$) is at most 10 ms or at most 25 ms or at most 50 ms or at most 100 ms.

7. The method according to claim 1, wherein the DeSat voltage ($V_{DSAT}$) determined at the first point in time ($t_n$) is greater than the DeSat voltage ($V_{DSAT}$) determined at the second point in time ($t_{n+1}$).

8. The method according to claim 1, wherein the second point in time ($t_{n+1}$) corresponds to a point in time with the lowest possible current or a zero crossing of a load current curve (200).

9. The method according to claim 1, wherein the first point in time ($t_n$) corresponds to a point in time with the highest possible current or a peak point or apex of a load current curve (200).

10. The method according to claim 1, wherein determining the operability of the semiconductor switch (10) from the plurality (310, 320, 330) of drain-source voltages for the plurality of different first points in time comprises:

comparing a drain-source voltage at a current first point in time with a drain-source voltage at an earlier first point in time, and determining an operability from the comparison result.

11. The method according to claim 10, wherein the comparison of the drain-source voltage at the current first point in time with the drain-source voltage at the earlier first point in time is carried out with the same load current ($I_L$) within permissible tolerances and/or the same junction temperature ($T_j$) within permissible tolerances.

12. The method according to claim 10, further comprising:

determining the operability of the semiconductor switch (10) as insufficient when a difference between the drain-source voltage at the current first point in time with the drain-source voltage at the earlier first point in time exceeds a threshold value.

13. The method according to claim 1, further comprising: performing an action when the operability of the semiconductor switch (10) is determined as insufficient.

14. The method according to claim 1, further comprising: storing the plurality (310, 320, 330) of drain-source voltages for the plurality of different first points in time in a memory device (416).

15. The method according to claim 1, wherein at least one of a high-side switch and a low-side switch of a half-bridge arrangement are monitored as semiconductor switch (10).

16. An inverter circuit (400) for driving an electric machine, comprising at least one semiconductor switch (10) and a control device (410), wherein the inverter circuit (400) is adapted to perform a method according to claim 1.

17. The inverter circuit according to claim 16, having a gate driver (20) with a DeSat terminal (DESAT), the current input terminal (10-1) of the semiconductor switch (10) being connected to the DeSat terminal (DESAT) of the gate driver (20) via the diode ($D_{DSAT}$) which is connected in the reverse direction, the connection point of the capacitor ($C_{DSAT}$) and the resistor component ($R_{DSAT}$) being connected to the DeSat terminal (DESAT) of the gate driver (20), the DeSat terminal (DESAT) of the gate driver (20) being connected to the potential terminal (VCC) via the current source ($I_C$).

18. An inverter circuit according to claim 16, further comprising a DeSat voltage measuring circuit (530) for detecting the DeSat voltage ($V_{DSAT}$), which is electrically isolated and connected to the control device (410).

19. An inverter circuit according to claim 16, wherein the gate driver (20) is connected to the control device (410) via a digital data interface (413) for transmitting the DeSat voltage ($V_{DSAT}$).

* * * * *